(12) United States Patent
Im (10) Patent No.: US 7,751,017 B2
(45) Date of Patent: Jul. 6, 2010

(54) DISPLAY APPARATUS

(75) Inventor: Dong-Sung Im, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 312 days.

(21) Appl. No.: 12/033,946

(22) Filed: Feb. 20, 2008

(65) Prior Publication Data

US 2008/0310091 A1 Dec. 18, 2008

(30) Foreign Application Priority Data

Jun. 18, 2007 (KR) .............. 10-2007-0059620

(51) Int. Cl.
*G02F 1/1333* (2006.01)
*F21V 7/04* (2006.01)

(52) U.S. Cl. ............... 349/151; 349/149; 362/631; 362/633

(58) Field of Classification Search .......... 362/631, 362/632, 633, 634; 361/748, 749, 752; 349/149, 349/150, 151, 152, 58, 61–63, 65
See application file for complete search history.

(56) References Cited

U.S. PATENT DOCUMENTS

| 7,259,822 B2 * | 8/2007 | Tsubokura et al. ......... 349/149 |
| 2005/0078459 A1 * | 4/2005 | Yeon .................... 361/749 |

* cited by examiner

*Primary Examiner*—John A Ward
(74) *Attorney, Agent, or Firm*—Cantor Colburn LLP (57) ABSTRACT

A display apparatus includes a backlight assembly, a display assembly and a board combining member. The backlight assembly includes a light source generating light and a container receiving the light source. The display assembly includes a display panel received in the container and displaying an image, a driving printed circuit board ("DPCB") disposed on an outer face of the container, and a flexible printed circuit board ("FPCB") connecting the DPCB to the display panel. The board combining member combines the DPCB with the outer face of the container to be capable of moving corresponding to a thermal expansion of the container such that a position of the DPCB with respect to the FPCB is not substantially changed. Thus, the FPCB is prevented from warping due to the thermal expansion of the container.

20 Claims, 9 Drawing Sheets

DISPLAY APPARATUS

The present application claims priority to Korean Patent Application No. 2007-59620, filed on Jun. 18, 2007, and all the benefits accruing therefrom under 35 U.S.C. §119, the contents of which in its entirety are herein incorporated by reference.

BACKGROUND OF THE INVENTION

1. Field of the Invention

The present invention relates to a display apparatus and a method thereof. More particularly, the present invention relates to a display apparatus having a backlight assembly and a method of protecting components of the display apparatus.

2. Description of the Related Art

In general, a liquid crystal display ("LCD") apparatus includes a display assembly displaying an image by using optical transmittance of liquid crystals and a backlight assembly disposed under the display assembly to provide the display assembly with light.

The display assembly includes a display panel displaying the image, a driving printed circuit board ("DPCB") driving the display panel, and a flexible printed circuit board ("FPCB") electrically connecting the DPCB to the display panel.

The backlight assembly includes a light source generating light and a container receiving the light source. In general, the container includes a metallic material in order to emit heat generated from the light source to the outside.

The DPCB is attached to an outer face of the container through screws in order to prevent the DPCB from moving due to external impacts.

BRIEF SUMMARY OF THE INVENTION

When a container of a conventional backlight assembly and display apparatus is expanded due to the heat generated from the light source, it has been discovered herein that a driving printed circuit board ("DPCB") may move in a direction of the thermal expansion of the container. However, when the DPCB fixed on the outer face of the container moves in the direction of the thermal expansion of the container with the container, it has been determined herein that the flexible printed circuit board ("FPCB") may be twisted, torn, or warped.

Thus, the present invention provides a display apparatus having a DPCB capable of moving in a direction of a thermal expansion of a container and independent of the container.

The present invention also provides a method of protecting components of the display apparatus by combining the DPCB with the container in a manner allowing the container to move in the direction of thermal expansion independent of the DPCB.

According to exemplary embodiments of the present invention, a display apparatus includes a backlight assembly, a display assembly and a board combining member.

The backlight assembly includes a light source generating light and a container receiving the light source. The display assembly includes a display panel received in the container and displaying an image, a DPCB disposed on an outer face of the container, and a FPCB connecting the DPCB to the display panel. The board combining member combines the DPCB with the outer face of the container to be capable of moving corresponding to a thermal expansion of the container, wherein the thermal expansion of the container does not substantially affect a position of the DPCB with respect to the FPCB.

The board combining member may include an adhesive tape that adheres the DPCB to the outer face of the container. The adhesive tape may include a metallic material. For example, the adhesive tape may include a substantially same metallic material as the container.

The board combining member may include a combining protrusion that is disposed on the outer face of the container and is inserted into a combining hole of the DPCB. The combining hole of the DPCB may have a shape extending in a direction of the thermal expansion of the container. The combining protrusion may have a guiding groove that prevents the DPCB from separating from the outer face of the container.

The board combining member may include a guiding protrusion that is disposed on the outer face of the container and combines the DPCB with the outer face of the container. Thus, the DPCB moves corresponding to the thermal expansion of the container without separating from the outer face of the container. The guiding protrusion may have a shape that presses one face of the DPCB so that the DPCB is combined with the outer face of the container.

The board combining member may combine opposite end portions of the DPCB with the outer face of the container, the opposite end portions of the DPCB disposed corresponding to a longitudinal direction of the container. The board combining member may make contact with a ground pattern of the DPCB so that the ground pattern of the DPCB is electrically connected to the container.

The container includes a bottom plate and a side wall formed on an edge portion of the bottom plate. The DPCB may be disposed on an outer face of the side wall and may be combined with the outer face of the side wall through the board combining member. Alternatively, the DPCB may be disposed on an outer face of the bottom plate and may be combined with the outer face of the bottom plate through the board combining member.

According to other exemplary embodiments of the present invention, a display apparatus includes a backlight assembly, a display assembly and a board combining member.

The backlight assembly includes a light source generating light and a container that receives the light source and has a first thermal expansion coefficient. The display assembly includes a display panel received in the container and displaying an image, a DPCB disposed on an outer face of the container, and an FPCB connecting the DPCB to the display panel, the DPCB having a second thermal expansion coefficient that is different from the first thermal expansion coefficient. The board combining member combines the DPCB with an outer face of the container to prevent the FPCB from warping due to a difference between the first and second thermal expansion coefficients.

The board combining member may include an adhesive tape that adheres the DPCB to the outer face of the container and includes a metallic material.

The board combining member may include a combining protrusion that is disposed on the outer face of the container and is inserted into a combining hole of the DPCB. The combining hole of the DPCB may have a shape extending in a direction for preventing the FPCB from warping.

The board combining member may include a guiding protrusion that is disposed on the outer face of the container and combines the DPCB with the outer face of the container to prevent the FPCB from warping. According to the present invention, since the DPCB is combined with the outer face of the container through the board combining member, the DPCB may move in the direction of the thermal expansion of the container, and independent of the container. Thus, the FPCB may be prevented from warping due to the thermal expansion of the container.

BRIEF DESCRIPTION OF THE DRAWINGS

The above and other features and advantages of the present invention will become more apparent by describing in detail exemplary embodiments thereof with reference to the accompanying drawings, in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 1:
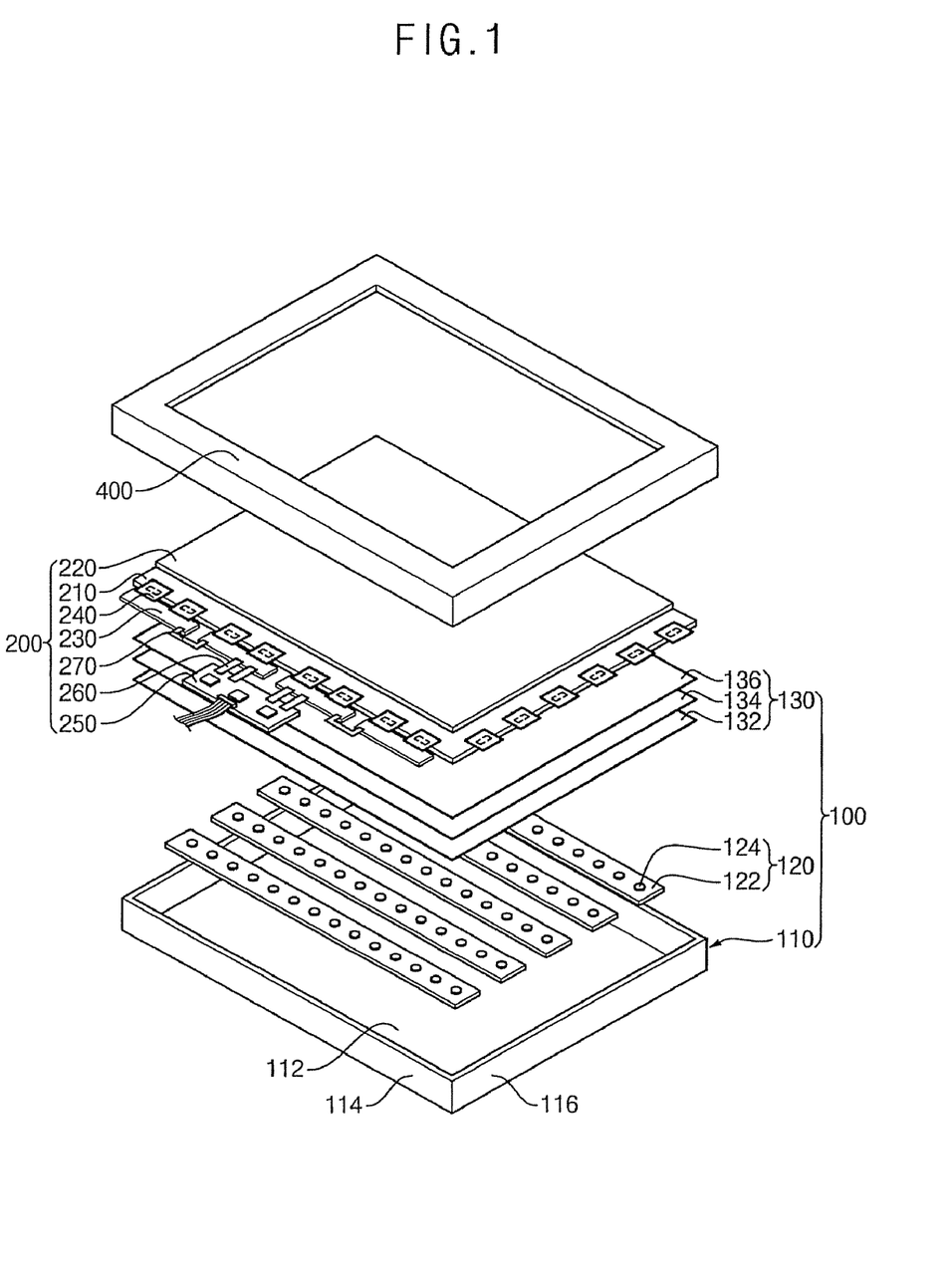
FIG. 1 is an exploded perspective view illustrating an exemplary display apparatus in accordance with a first exemplary embodiment of the present invention.
Figure 2:
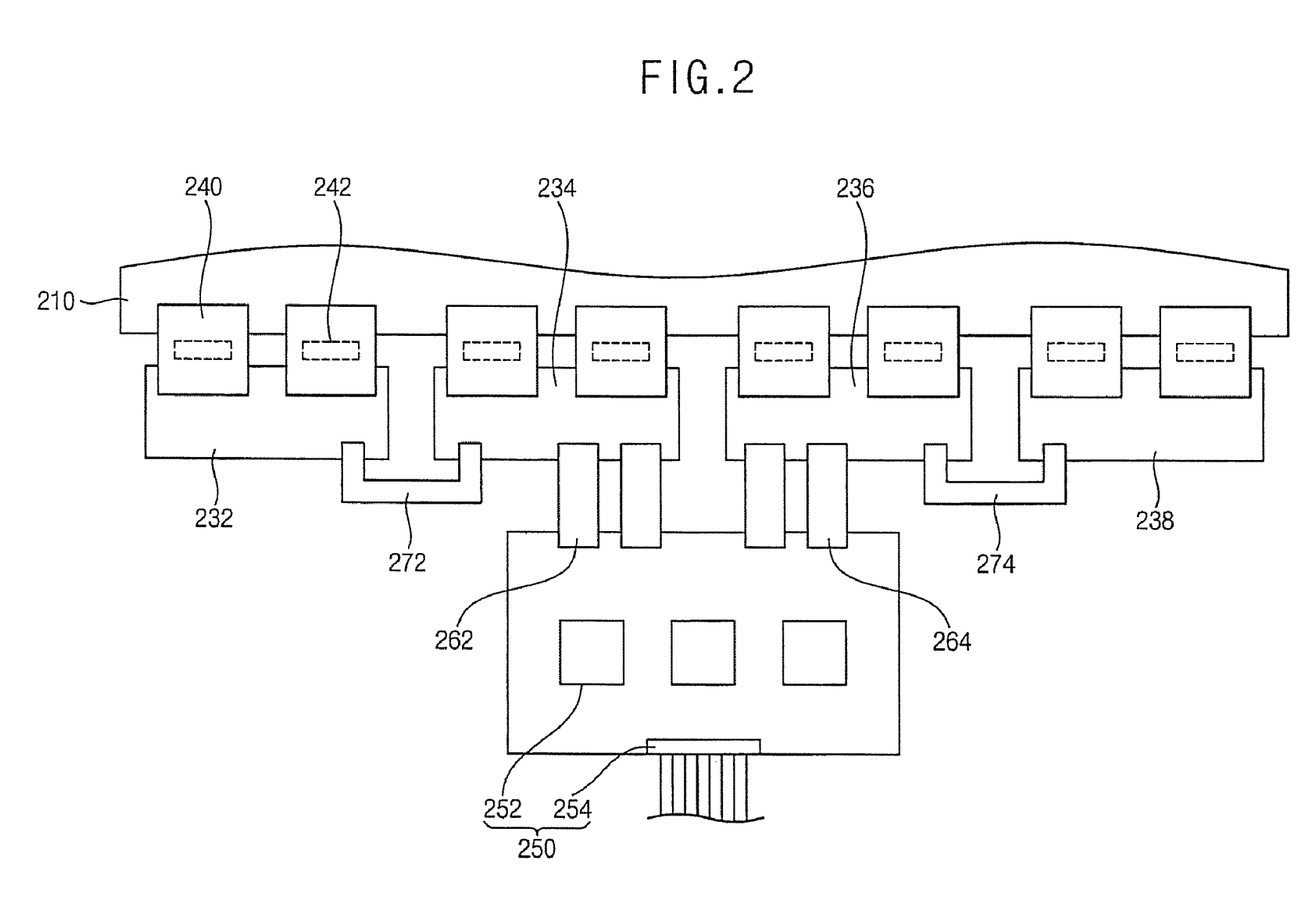
FIG. 2 is a plan view illustrating exemplary electrical connection relationships among a first substrate, a driving printed circuit board ("DPCB") and a flexible printed circuit board ("FPCB") of the exemplary display apparatus shown in FIG. 1.
Figure 3:
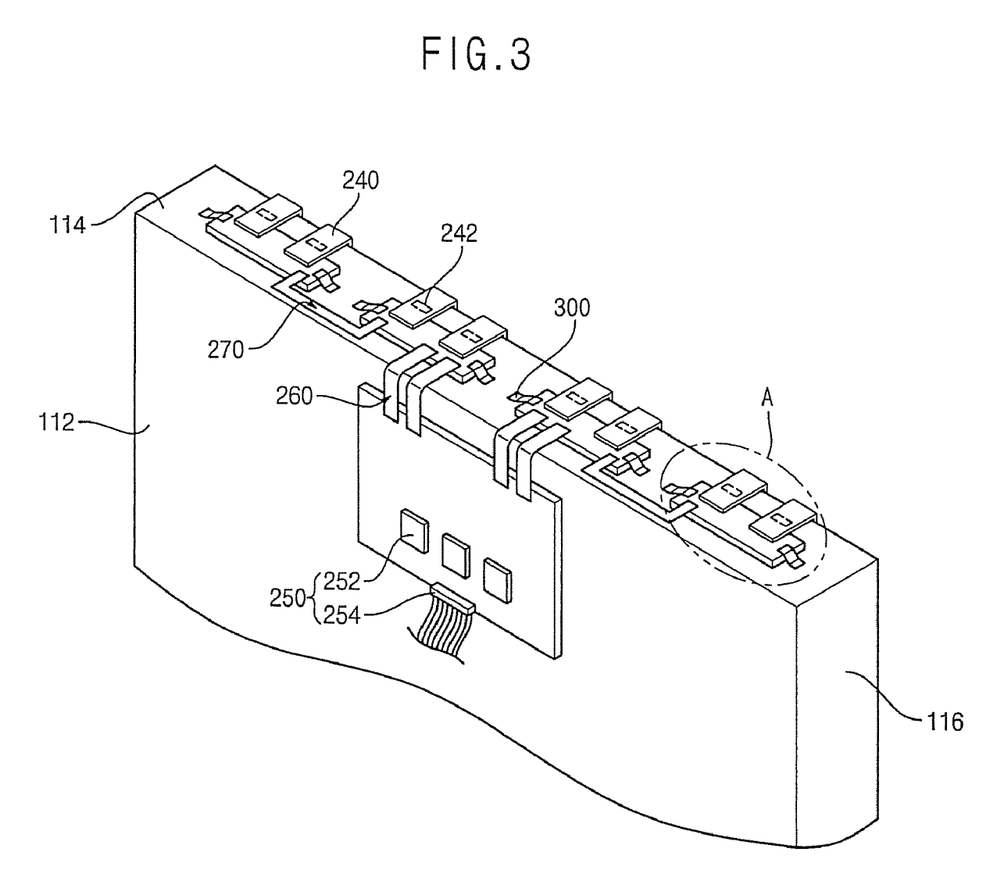
FIG. 3 is a perspective view illustrating an exemplary disposition relationship between a DPCB and a control board of the exemplary display apparatus shown in FIG. 1.

FIG. 1 is an exploded perspective view illustrating an exemplary display apparatus in accordance with a first exemplary embodiment of the present invention. FIG. 2 is a plan view illustrating exemplary electrical connection relationships among a first substrate, a driving printed circuit board ("DPCB") and a flexible printed circuit board ("FPCB") of the exemplary display apparatus shown in FIG. 1. FIG. 3 is a perspective view illustrating an exemplary disposition relationship between a DPCB and a control board of the exemplary display apparatus shown in FIG. 1.

Referring to FIGS. 1, 2 and 3, a display apparatus in accordance with the present exemplary embodiment includes a backlight assembly 100, a display assembly 200, a board combining member (further described below), and a top chassis 400.

The backlight assembly 100 includes a container 110, a light source 120 and optical member 130.

The container 110 includes a bottom plate 112 having a plate shape and a side wall formed on an edge of the bottom plate 112. The bottom plate 112 may have a substantially rectangular shape in a plan view. The side wall may include a pair of opposing longer side walls 114 and a pair of opposing shorter side walls 116.

The longer side walls 114 are disposed on opposite end portions in a horizontal direction of the bottom plate 112 corresponding to each other. The shorter side walls 116 are disposed on opposite end portions in a longitudinal direction of the bottom plate 112 corresponding to each other, and the shorter side walls 116 connect opposing edges of the longer side walls 114. Together, the bottom plate 112, longer side walls 114, and shorter side walls 116 of the container 110 form a receiving space for receiving the light source 120 and optical member 130.

The light source 120 is disposed in the container 110, and generates light. The light source 120 may include a light source driving part 122 and a light-emitting diode ("LED") 124 disposed on the light source driving part 122. In an exemplary embodiment, the light source driving part 122 may extend in the longitudinal direction of the bottom plate 112, and a plurality of light source driving parts 122 are disposed along the horizontal direction of the bottom plate 112.

The light source driving part 122 supplies a power to the LED 124. A plurality of LEDs 124 may be disposed substantially in parallel along the longitudinal direction of the bottom plate 112.

In alternative exemplary embodiments, the light source 120 may include other light generating members than the LED 124. For example, the light source 120 may include at least one of a cold cathode fluorescent lamp ("CCFL"), a hot cathode fluorescent lamp ("HCFL"), an external electrode fluorescent lamp ("EEFL") and a surface light source.

Since the plurality of LEDs 124 emit more heat than other light generating members, the container 110 should have a structure that is capable of emitting the heat to the outside of the container 110.

The optical member 130 is disposed in the container 110, and is disposed over the light source 120. The optical member 130 improves optical characteristics of the light generated from the light source 120, for example, uniformity of brightness, brightness of a front view etc. In an exemplary embodiment, the optical member 130 may include a diffusing plate 132, a first prism sheet 134 and a second prism sheet 136. Alternatively, the optical member 130 may include more or less optical sheets.

The display assembly 200, for example, may include a display panel, a DPCB 230, a FPCB 240, a control board 250 and a control connection film 260. The display assembly 200 is disposed on the backlight assembly 100, and displays an image using the light generated from the backlight assembly 100.

The display panel may include a first substrate 210, a second substrate 220 and a liquid crystal layer.

The first substrate 210 may include a plurality of signal lines, such as gate lines and data lines, a plurality of thin-film transistors ("TFTs") connected to the signal lines, and a plurality of pixel electrodes connected to the TFTs.

The second substrate 220 is disposed opposite to the first substrate 210. The second substrate 220 may include a common electrode receiving a common voltage and a plurality of color filters corresponding to the pixel electrodes.

The liquid crystal layer is interposed between the first and the second substrates 210 and 220, and includes liquid crystal molecules to be rearranged due to an electric field that is generated between the pixel electrodes and the common electrode.

The DPCB 230 includes a driving circuit that drives the display panel. The DPCB 230 may be disposed on an outer face of the side wall of the container 110. For example, the DPCB 230 may be disposed on an outer face of one of the longer side walls 114.

The FPCB 240 electrically connects the DPCB 230 to the first substrate 210 to apply a driving signal generated from the DPCB 230 to signal lines of the first substrate 210. The FPCB 240 is bent so that the DPCB 230 is disposed on the outer face of the one of the longer side walls 114. A driving integrated circuit ("IC") 242 for driving the display panel may be disposed on the FPCB 240. The driving IC 242 for driving the display panel may be disposed on not only the FPCB 240, but also the first substrate 210.

The control board 250 receives externally provided image data to generate a control signal for controlling the DPCB 230.

For example, the control board 250 may include a control device 252 generating the control signal in response to the image data, and a connector 254 connected to an external graphic controller to transmit the image data to the control device 252. The control board 250 may be disposed on an outer face of the bottom plate 112 of the container 110. For example, the control board 250 may be disposed near the DPCB 230. In an exemplary embodiment, the control board 250 may be arranged such that it is disposed to be substantially perpendicular to the DPCB 230.

The control connection film 260 electrically connects the control board 250 to the DPCB 230. The control connection film 260 transmits the control signal generated from the control board 250 to the DPCB 230. The control connection film 260 is bent so as to connect the control board 250 disposed on the outer face of the bottom plate 112 of the container 110 to the DPCB 230 disposed on the outer face of the longer side wall 114 of the container 110.

The board combining member combines the DPCB 230 with the outer face of one of the longer side walls 114 so as to be capable of moving corresponding to a thermal expansion of the container 110. When the container 110 expands due to the heat generated from the light source 120, the DPCB 230 moves corresponding to a thermal expansion of the container 110, so that the DPCB 230 may maintain an original position without moving together with the outer face of the longer side wall 114. In other words, the DPCB 230 is not rigidly fixed to the outer face of the longer side wall 114, so that the container 110 may thermally expand without disrupting an original position of the DPCB 230 with respect to the FPCB 240. When the positional relationship between the DPCB 230 and the FPCB 240 is maintained despite thermal expansion of the container 110, the FPCB 240 is protected from damage due to warping and tearing.

Alternately, the board combining member combines the DPCB 230 with the outer face of one of the longer side walls 114 to compensate for a difference between a first thermal expansion coefficient of the container 110 and a second thermal expansion coefficient of the DPCB 230. The difference between the first and second thermal expansion coefficients is compensated for, so that the FPCB 240 may be prevented from warping due to the difference between the first and second thermal expansion coefficients.

The top chassis 400 is disposed over the display assembly 200 to hold the display assembly 200 to the backlight assembly 100. For example, the top chassis 400 may be combined to the side wall of the container 110 to hold the display assembly 200 to the backlight assembly 100.

The top chassis 400 has an opening part for displaying an image of the display panel.

In the present exemplary embodiment, the container 110 may have a structure capable of supporting and holding an edge of the display panel of the display assembly 200. Thus, a mold frame for supporting the edge of the display panel may be omitted. When the mold frame is omitted, the heat generated from the light source 120 may be emitted effectively to the outside through the container 110.

Referring again to FIGS. 2 and 3, electrical connection relationships among the first substrate 210, the DPCB 230, the FPCB 240, the control board 250, and control connection film 260, for example, are described below.

At least one of the DPCB 230 may be disposed along a longitudinal direction of one of the longer side walls 114. For example, a first DPCB 232, a second DPCB 234, a third DPCB 236 and a fourth DPCB 238 may be disposed along the longitudinal direction of one of the longer side walls 114, in sequence.

Each of the first, second, third and fourth DPCBs 232, 234, 236 and 238 is electrically connected to the first substrate 210 through the FPCB 240. Each of the first, second, third and fourth DPCBs 232, 234, 236 and 238 may be electrically connected to the first substrate 210 through one or more FPCBs 240. In the illustrated exemplary embodiment, for example, each of the first, second, third and fourth DPCBs 232, 234, 236 and 238 is electrically connected to the first substrate 210 through two FPCBs 240.

The control board 250, for example, may be disposed on the outer face of the bottom plate 112, and may face the second and third DPCBs 234 and 236. In an exemplary embodiment where more or less DPCBs 230 are utilized, the control board 250 may be disposed to face a centrally disposed DPCB 230, or between a pair of centrally disposed DPCBs 230 among the DPCBs 230.

The control board 250 may be connected respectively to the second and third DPCBs 234 and 236 through at least one of the control connection film 260.

For example, the control board 250 may be connected to the second DPCB 234 through a first control connection film 262, and may be connected to the third DPCB 236 through a second control connection film 264. In an exemplary embodiment, each of the first and second control connection films 262, 264 may include a pair of control connection films.

In the present exemplary embodiment, the display assembly 200 may further include at least one side connection film 270 that electrically connects between the first, second, third and fourth DPCBs 232, 234, 236 and 238.

For example, the display assembly 200 may include a first side connection film 272 electrically connecting between the first and second DPCBs 232 and 234, and a second side connection film 274 electrically connecting between the third and fourth DPCBs 236 and 238. In an exemplary embodiment where more than four DPCBs 230 are utilized, side connection films 270 may be employed between adjacent DPCBs 230 to provide an electrical connection there between, and to provide an electrical connection with the control board 250.

Figure 4:
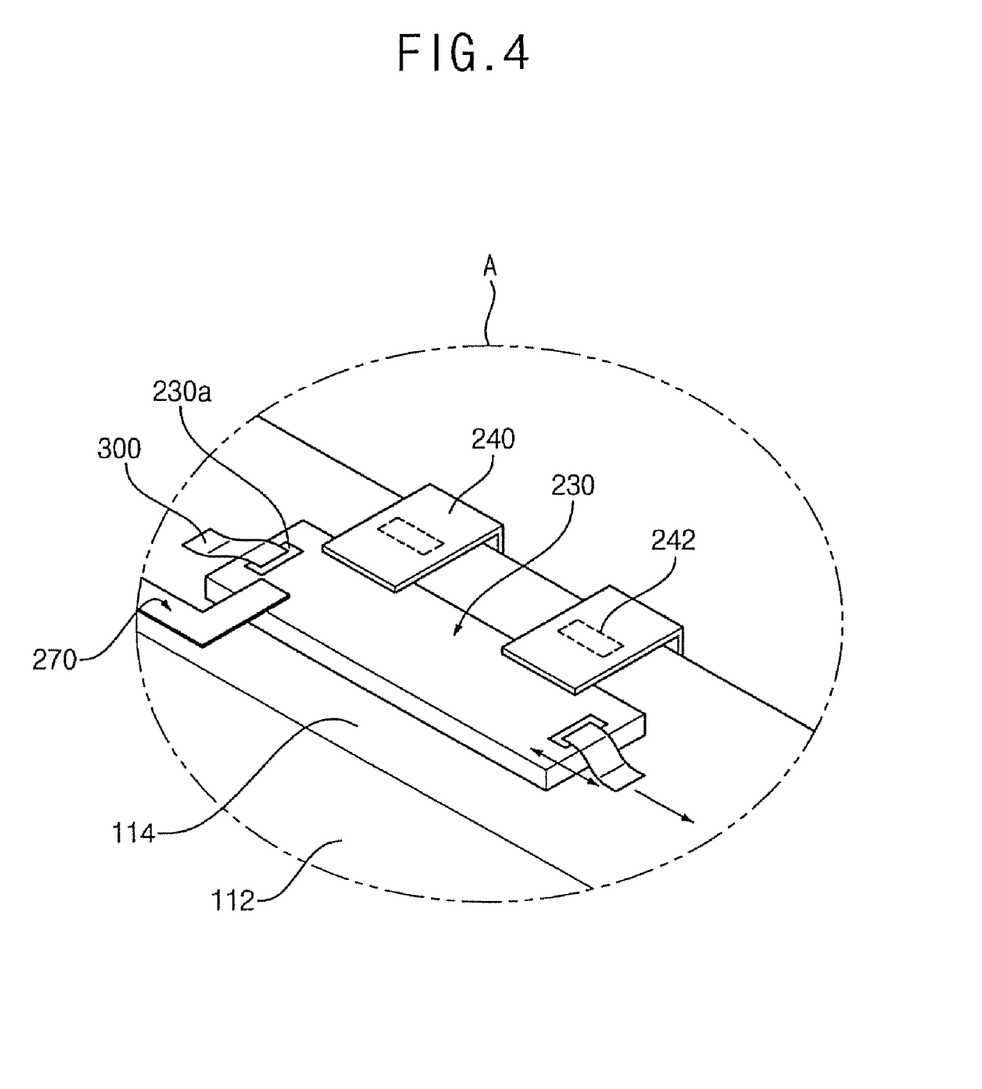
FIG. 4 is an enlarged perspective view illustrating portion 'A' of the exemplary display apparatus shown in FIG. 3.

FIG. 4 is an enlarged perspective view illustrating portion 'A' of the display apparatus shown in FIG. 3.

Referring to FIGS. 3 and 4, the board combining member in accordance with an exemplary embodiment may be an adhesive tape 300 that adheres the DPCB 230 to the outer face of the one of the longer side walls 114.

The adhesive tape 300 may be a paper tape or a polymer tape, but may preferably be a metallic tape that transmits heat or electric current. That is, the adhesive tape 300 may include a metallic material that transmits heat or electric current.

The container 110 may include a metallic material, for example, but not limited to, aluminum (Al), that may absorb the heat generated from the light source 120, and emit the heat to the outside.

The adhesive tape 300 may include substantially the same metallic material as the container 110. That is, the adhesive tape 300 may include a metallic material that has substantially the same thermal expansion coefficient of the container 110.

Since the adhesive tape 300 includes the metallic material that has substantially the same thermal expansion coefficient of the container 110, the adhesive tape 300 may expand corresponding to the thermal expansion speed of the container 110. Thus, the DPCB 230 is prevented from moving along a direction of the thermal expansion of the container 110. In other words, when the container 110 thermally expands, so does the adhesive tape 300, and therefore the DPCB 230 maintains an original position with respect to the FPCB 240 despite thermal expansion of the container 110.

The adhesive tape 300 may combine opposite end portions of the DPCB 230 with the outer face of the one of the longer side walls 114. The opposite end portions of the DPCB 230 are disposed corresponding to the longitudinal direction of the container 110. That is, the adhesive tape 300 adheres the opposite end portions of the DPCB 230 and the outer face of the one of the longer side walls 114 so that the DPCB 230 is combined to the outer face of the one of the longer side walls 114.

When the adhesive tape 300 adheres the opposite end portions of the DPCB 230 and the outer face of the one of the longer side walls 114, the DPCB 230 is capable of moving along the longitudinal direction of the container 110 against the one of the longer side walls 114. Thus, even though the longer side walls 114 expand in the longitudinal direction of the container 110 due to the heat generated from the light source 120, the DPCB 230 may be prevented from moving along the direction of the thermal expansion of the container 110.

In the present exemplary embodiment, the DPCB 230 may further include a ground pattern 230a that is formed on an outer face of a substrate of the DPCB 230. The ground pattern 230a is disposed on the opposite end portions of the DPCB 230 to be electrically contacted with the adhesive tape 300. Thus, the ground pattern 230a is electrically connected to the container 110 through the adhesive tape 300.

Figure 5:
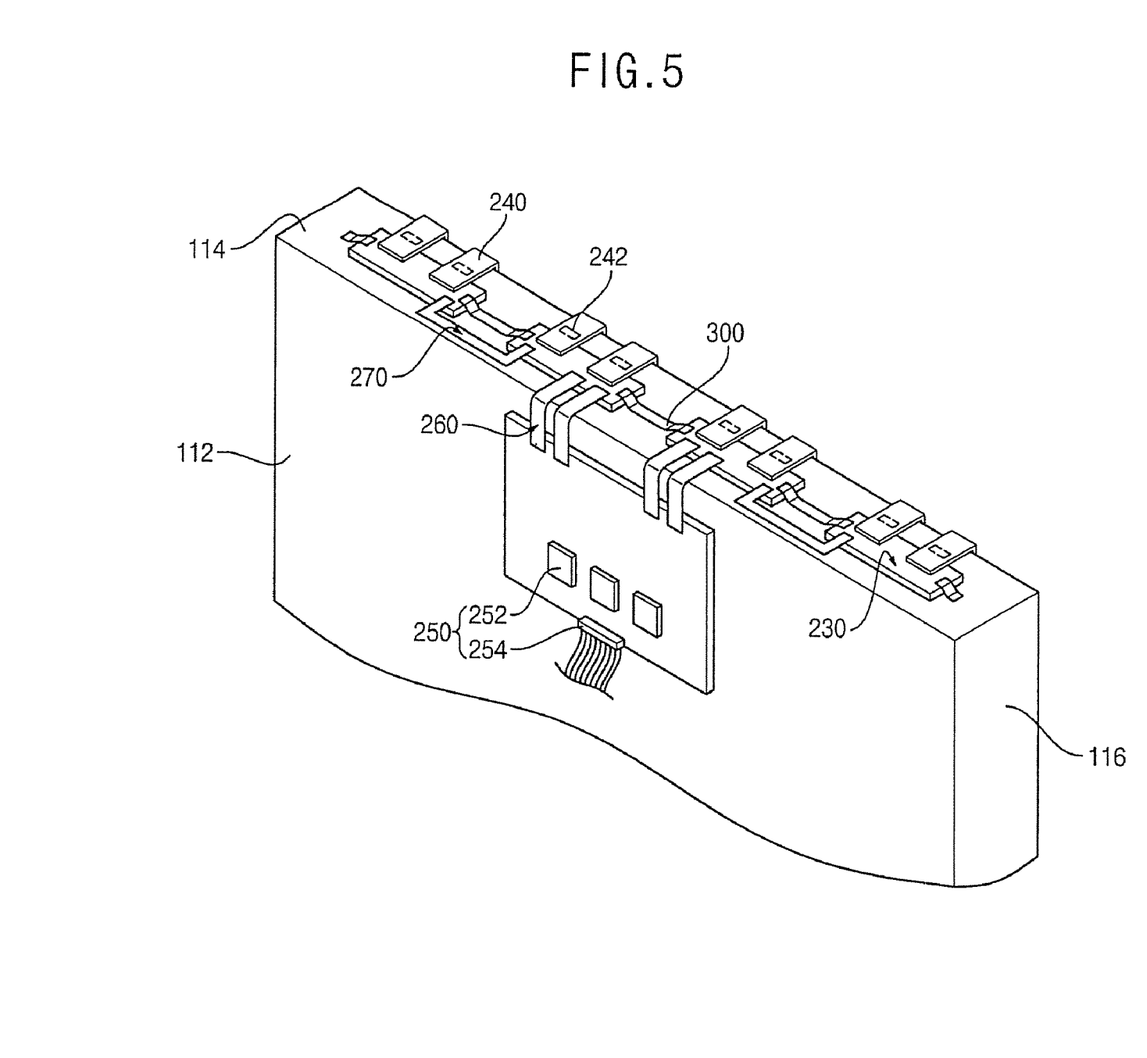
FIG. 5 is a perspective view illustrating a part of an exemplary display apparatus in accordance with a second exemplary embodiment of the present invention.

FIG. 5 is a perspective view illustrating a part of an exemplary display apparatus in accordance with a second exemplary embodiment of the present invention.

Referring to FIG. 5, an adhesive tape 300 in accordance with the present exemplary embodiment may be disposed on each opposing ends of two adjacent DPCBs 230 so that the two DPCBs 230 are combined with the outer face of the one of the longer side walls 114.

As shown in FIG. 4, the adhesive tape 300 may combine one of the DPCBs 230 with the outer face of the one of the longer side walls 114. However, as shown in FIG. 5, the adhesive tape 300 may adhere between the two DPCBs 230 to combine the two DPCBs 230 with the outer face of the one of the longer side walls 114.

According to the first and second exemplary embodiments, since the DPCB 230 is adhered to the outer face of the one of the longer side walls 114 through the adhesive tape 300, the DPCB 230 may be prevented from moving along the direction of the thermal expansion of the container 110. In other words, the DPCB 230 maintains an original position with respect to the FPCB 240, despite thermal expansion of the container 110. Thus, the FPCB 240 electrically connecting the DPCB 230 to the first substrate 210 may be prevented from warping and tearing due to the thermal expansion of the container 110.

Figure 6:
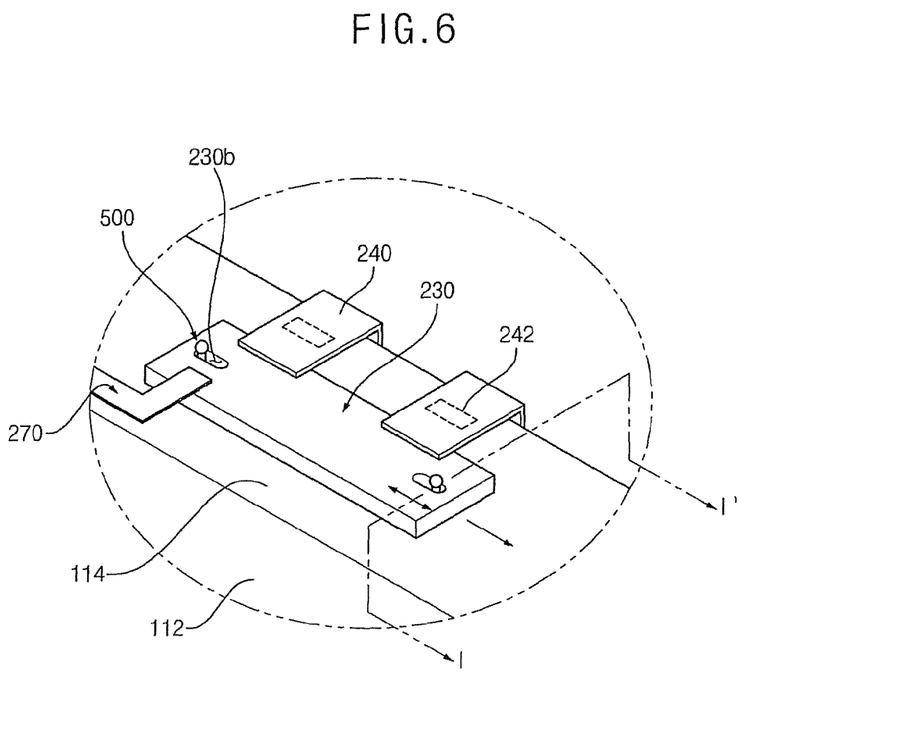
FIG. 6 is a perspective view illustrating a part of an exemplary display apparatus in accordance with a third exemplary embodiment of the present invention.
Figure 7:
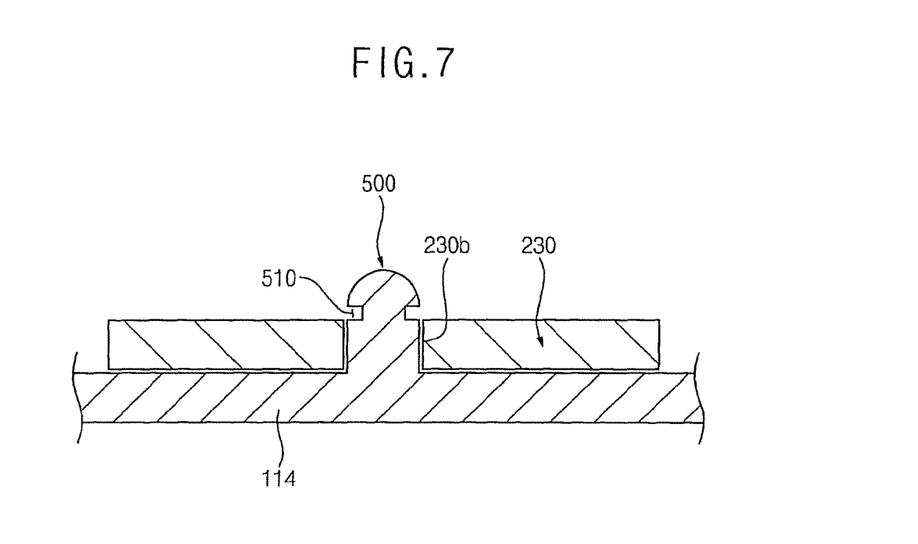
FIG. 7 is a cross-sectional view taken along line I-I' of FIG. 6.

FIG. 6 is a perspective view illustrating a part of an exemplary display apparatus in accordance with a third exemplary embodiment of the present invention. FIG. 7 is a cross-sectional view taken along line I-I' of FIG. 6.

Referring to FIGS. 6 and 7, a board combining member in accordance with the present exemplary embodiment, may include a combining protrusion 500 that is formed on the outer face of the container 110, for example, the outer face of the one of the longer side walls 114 of the container 110.

Two combining protrusions 500 may be disposed with respect to the opposite end portions of the DPCB 230 that are disposed corresponding to the longitudinal direction of the container 110. Each of the DPCB 230 may have two combining holes 230b formed corresponding to the opposite end portions of the DPCB 230, so that the two combining protrusions 500 may be inserted into the two combining holes 230b, respectively.

The combining holes 230b of the DPCB 230 may have a shape extending in the direction of the thermal expansion of the container 110. For example, the combining holes 230b of the DPCB 230 may have a shape extending in the longitudinal direction of the container 110.

Since the two combining protrusions 500 are inserted into the two combining holes 230b having a shape extending in the longitudinal direction, respectively, the DPCB 230 may be capable of moving along the direction of the thermal expansion of the container 110, independent of the container 110. That is, the DPCB 230 may maintain the original position when the container 110 expands in the longitudinal direction. For example, the DPCB 230 may move in the horizontal direction with respect to the outer face of the container 110.

Each of the two combining protrusions 500 may have a guiding groove 510 for preventing the DPCB 230 from separating from the outer face of the container 110.

That is, when the combining protrusion 500 inserted into the combining hole 230b is away from the outer face of the container 110, one portion of the DPCB 230 is held by the guiding groove 510 to prevent the DPCB 230 from separating from the outer face of the container 110.

Figure 8:
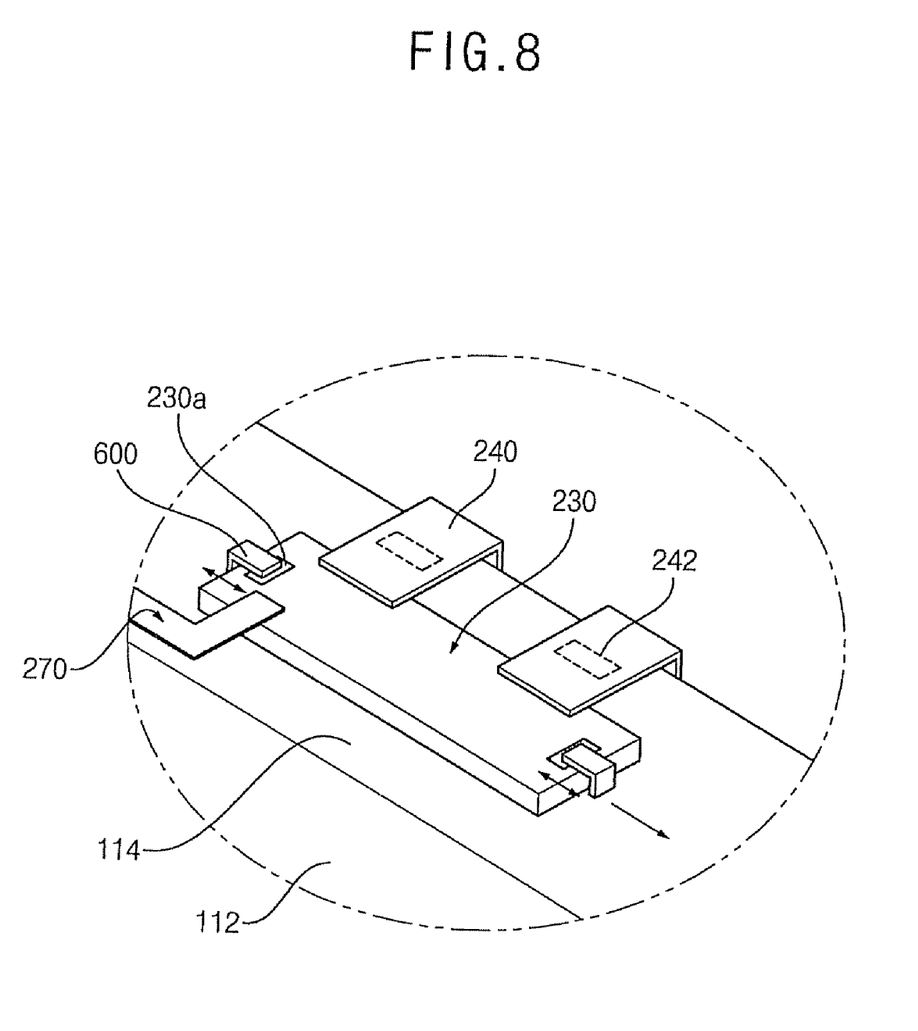
FIG. 8 is a perspective view illustrating a part of an exemplary display apparatus in accordance with a fourth exemplary embodiment of the present invention.

FIG. 8 is a perspective view illustrating a part of an exemplary display apparatus in accordance with a fourth exemplary embodiment of the present invention.

Referring to FIG. 8, a board combining member in accordance with the present exemplary embodiment may include a guiding protrusion 600 that is formed on the outer face of the container 110, for example, the outer face of the one of the longer side walls 114 of the container 110.

Two guiding protrusions 600 may be disposed with respect to the opposite end portions of the DPCB 230 that are disposed corresponding to the longitudinal direction of the container 110. The guiding protrusion 600 may fix the opposite end portions of the DPCB 230 to the outer face of the one of the longer side walls 114 so that the DPCB 230 is capable of moving along the longitudinal direction of the container 110 without separating from the outer face of the container 110.

The guiding protrusion 600 may have a shape capable of pressing one face of the DPCB 230 so that the DPCB 230 is fixed to the outer face of the one of the longer side walls 114. For example, a cross-section of the guiding protrusion 600 may have an L-shape or a T-shape. The guiding protrusion 600 may be separated from the DPCB 230 along the longitudinal direction of the container 110 so that the DPCB 230 is capable of moving along the longitudinal direction.

Since the guiding protrusion 600 presses one face of the DPCB 230 so that the DPCB 230 is fixed to the outer face of the one of the longer side walls 114, the DPCB 230 may be capable of moving along the direction of the thermal expansion of the container 110, independent of the container 110. That is, the DPCB 230 may maintain the original position with respect to the FPCB 240 when the container 110 expands along the direction of the thermal expansion of the longer side walls 114.

Figure 9:
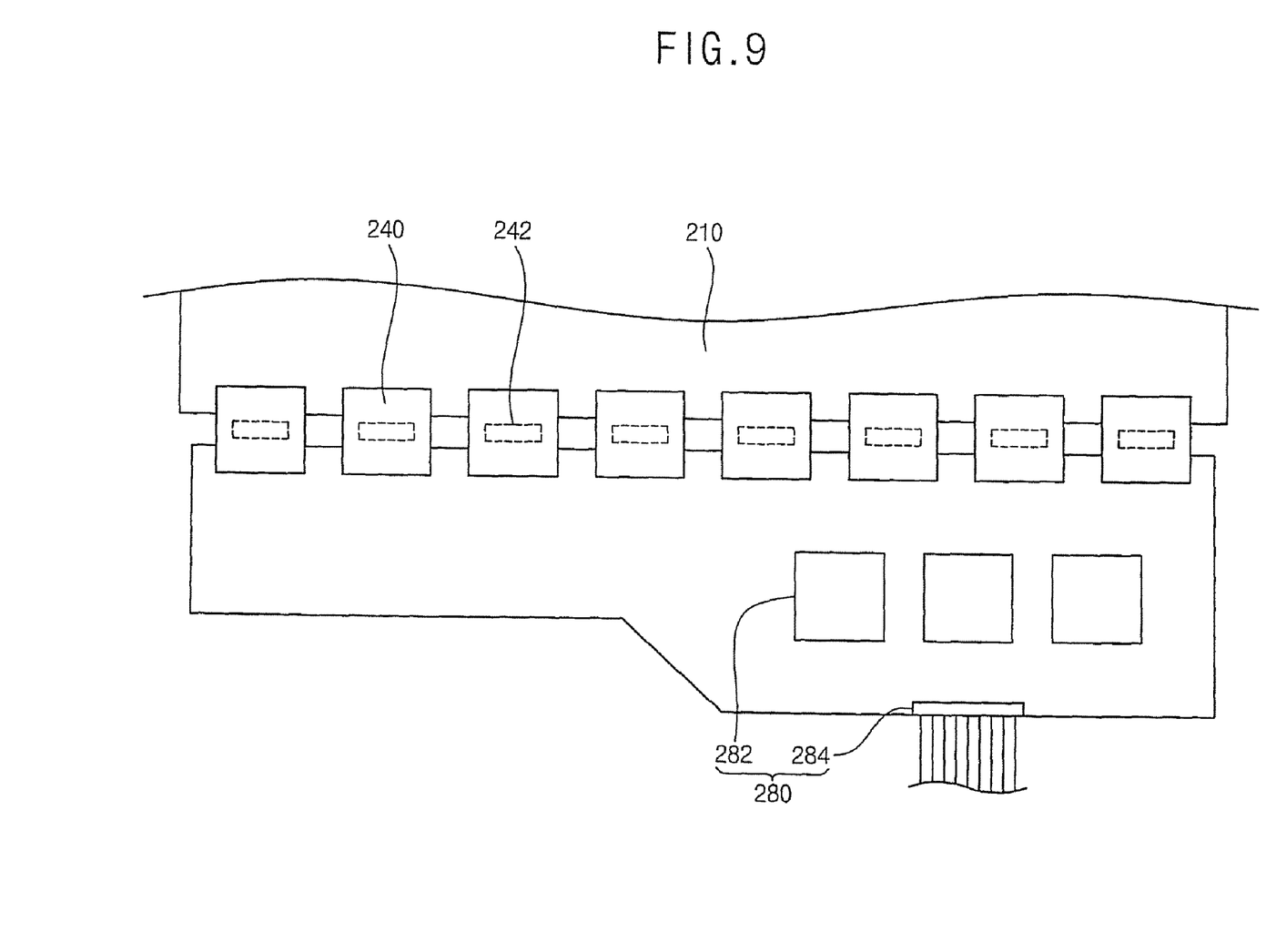
FIG. 9 is a plan view illustrating exemplary electrical connection relationships among a first substrate and a DPCB of an exemplary display apparatus in accordance with a fourth exemplary embodiment of the present invention.
Figure 10:
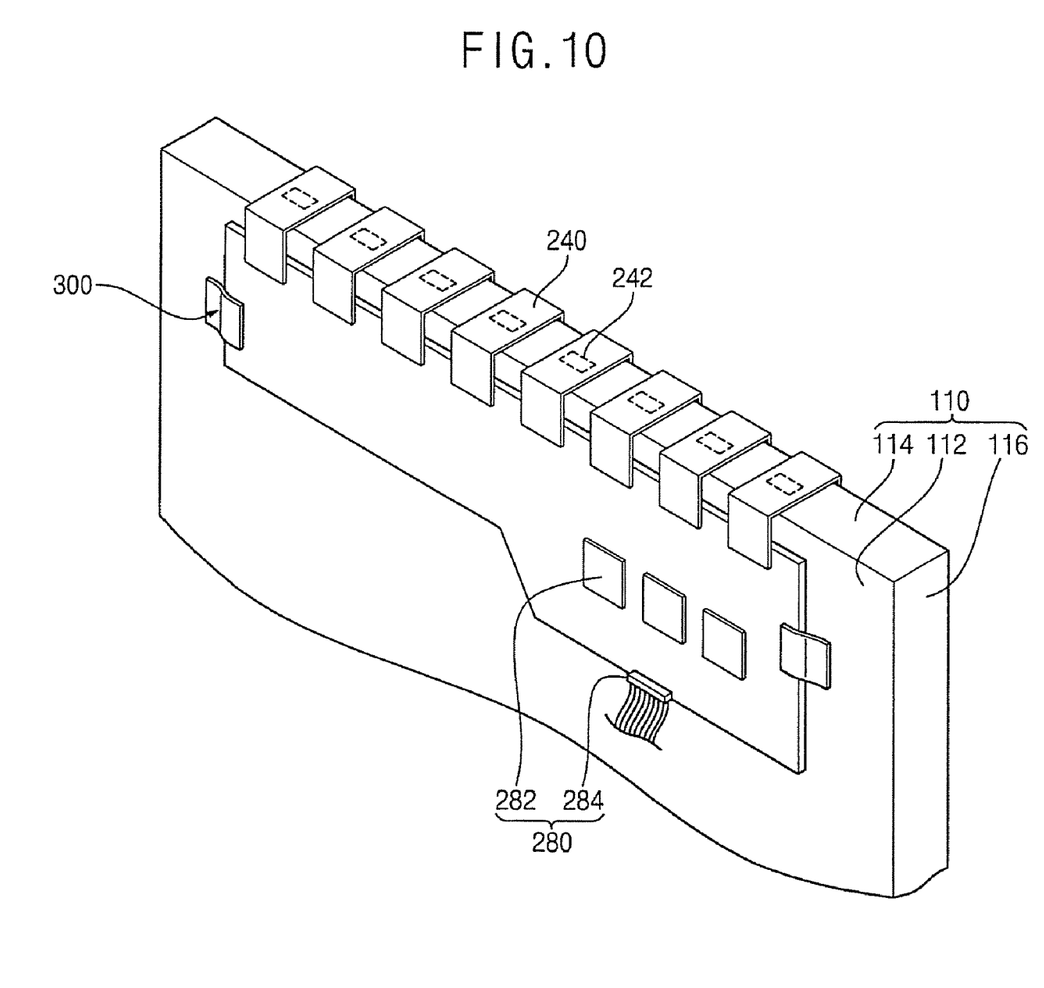
FIG. 10 is a perspective view illustrating an exemplary disposition relationship between the DPCB and a container of the exemplary display apparatus shown in FIG. 9.

FIG. 9 is a perspective view illustrating exemplary electrical connection relationships among a first substrate and a DPCB of an exemplary display apparatus in accordance with a fourth exemplary embodiment of the present invention. FIG. 10 is a perspective view illustrating an exemplary disposition relationship between the DPCB and a container of the exemplary display apparatus shown in FIG. 9.

Referring to FIGS. 9 and 10, a display apparatus in accordance with the present exemplary embodiment, includes a backlight assembly, a display assembly, a board combining member and a top chassis.

The backlight assembly and the top chassis of the display apparatus of FIGS. 9 and 10 may be substantially the same as the backlight assembly 100 and the top chassis 400 shown in FIGS. 1 to 8. Thus, descriptions of the backlight assembly and the top chassis may be omitted.

The display assembly includes a display panel, a DPCB 280 and a FPCB 240. The display panel may be substantially the same as the display panel shown in FIGS. 1 to 8. Thus, descriptions of the display panel may be omitted.

The DPCB 280 is disposed on an outer face of the bottom plate 112 of the container 110. For example, the DPCB 280 may include a control device 282 generating a control signal in response to image data, and a connector 284 connected to an external graphic controller to transmit the image data to the control device 282. Thus, the control board 250 shown in FIGS. 1 to 8 may be omitted in the present exemplary embodiment.

The board combining member combines the DPCB 280 with the outer face of the bottom plate 112, so that the DPCB 280 is capable of moving corresponding to a thermal expansion of the container 110, and independent of the container 110. Alternatively, the board combining member combines the DPCB 280 with the outer face of the bottom plate 112 to compensate for a difference between a first thermal expansion coefficient of the container 110 and a second thermal expansion coefficient of the DPCB 280.

Although the board combining member is illustrated in FIG. 10 as the adhesive tape 300 shown in FIGS. 3 to 5, in the present exemplary embodiment, the board combining member may alternatively be the combining protrusion 500 shown in FIG. 6, or the guiding protrusion 600 shown in FIG. 7. Descriptions of the board combining member are substantially the same as the adhesive tape 300, the combining protrusion 500 or the guiding protrusion 600 shown in FIGS. 3 to 7, except for the forming location of the board combining member. That is, the board combining member for the DPCB 280 of FIGS. 9 to 10 is formed with respect to the bottom plate 112 instead of the longer side wall 114 as in the prior exemplary embodiments.

According to the present invention, since a DPCB is combined with an outer face of a container through a board combining member, the DPCB may move in the direction of a thermal expansion of the container, and may move independent of the container so as to maintain a stable positional relationship with the FPCB. Thus, an FPCB may be prevented from warping and tearing due to the thermal expansion of the container.

This invention has been described with reference to exemplary embodiments. It is evident, however, that many alternative modifications and variations will be apparent to those having skill in the art in light of the foregoing description. Accordingly, the present invention embraces all such alternative modifications and variations as falling within the spirit and scope of the appended claims.

What is claimed is:

1. A display apparatus comprising:
   a backlight assembly that comprises a light source generating light and a container receiving the light source;
   a display assembly that comprises a display panel received in the container and displaying an image, a driving printed circuit board disposed on an outer face of the container, and a flexible printed circuit board connecting the driving printed circuit board to the display panel; and
   a board combining member that combines the driving printed circuit board with the outer face of the container to be capable of moving corresponding to a thermal expansion of the container, wherein the thermal expansion of the container does not substantially affect a position of the driving printed circuit board with respect to the flexible printed circuit board.

2. The display apparatus of claim 1, wherein the board combining member comprises an adhesive tape that adheres the driving printed circuit board to the outer face of the container.

3. The display apparatus of claim 2, wherein the adhesive tape includes a metallic material.

4. The display apparatus of claim 2, wherein the adhesive tape includes a substantially same metallic material as the container.

5. The display apparatus of claim 1, wherein the board combining member comprises a combining protrusion that is disposed on the outer face of the container and is inserted into a combining hole of the driving printed circuit board, and
   the combining hole of the driving printed circuit board has a shape extending in a direction of the thermal expansion of the container.

6. The display apparatus of claim 5, wherein the combining protrusion has a guiding groove that prevents the driving printed circuit board from separating from the outer face of the container.

7. The display apparatus of claim 1, wherein the board combining member comprises a guiding protrusion that is disposed on the outer face of the container and combines the driving printed circuit board with the outer face of the container so that the driving printed circuit board moves corresponding to the thermal expansion of the container without separating from the outer face of the container.

8. The display apparatus of claim 7, wherein the guiding protrusion has a shape that presses one face of the driving printed circuit board so that the driving printed circuit board is combined with the outer face of the container.

9. The display apparatus of claim 1, wherein the board combining member combines opposite end portions of the driving printed circuit board with the outer face of the container, and the opposite end portions of the driving printed circuit board are disposed corresponding to a longitudinal direction of the container.

10. The display apparatus of claim 1, wherein the board combining member makes contact with a ground pattern of the driving printed circuit board so that the ground pattern of the driving printed circuit board is electrically connected to the container.

11. The display apparatus of claim 1, wherein the container comprises a bottom plate and a side wall formed on an edge portion of the bottom plate, and
    the driving printed circuit board is disposed on an outer face of the side wall and is combined with the outer face of the side wall through the board combining member.

12. The display apparatus of claim 11, wherein the side wall comprises a pair of longer side walls disposed corresponding to each other and a pair of shorter side walls disposed corresponding to each other, the shorter side walls connecting edge portions of the longer side walls, and
    the driving printed circuit board is disposed on an outer face of one of the longer side walls.

13. The display apparatus of claim 12, further comprising a plurality of driving printed circuit boards disposed along a longitudinal direction of the one of the longer side walls.

14. The display apparatus of claim 13, wherein the board combining member comprises an adhesive tape disposed on each opposing ends of two adjacent driving printed circuit boards so that the two driving printed circuit boards are combined with the outer face of the one of the longer side walls.

15. The display apparatus of claim 11, wherein the display assembly comprises;
    a control board that is disposed on an outer face of the bottom plate of the container and controls the driving printed circuit board; and
    a control connection film connecting the control board with the driving printed circuit board.

16. The display apparatus of claim 1, wherein the container comprises a bottom plate and a side wall being formed on an edge portion of the bottom plate, and
    the driving printed circuit board is disposed on an outer face of the bottom plate and is combined with the outer face of the bottom plate due to the board combining member.

17. A display apparatus comprising:
    a backlight assembly comprising a light source generating light and a container that receives the light source and has a first thermal expansion coefficient;
    a display assembly that comprises a display panel received in the container and displaying an image, a driving printed circuit board disposed on an outer face of the container, and a flexible printed circuit board connecting the driving printed circuit board to the display panel, the driving printed circuit board having a second thermal expansion coefficient that is different from the first thermal expansion coefficient; and
    a board combining member that combines the driving printed circuit board with the outer face of the container to prevent the flexible printed circuit board from warping due to a difference between the first and second thermal expansion coefficients.

18. The display apparatus of claim 17, wherein the board combining member comprises an adhesive tape that adheres the driving printed circuit board to the outer face of the container and includes a metallic material.

19. The display apparatus of claim 17, wherein the board combining member comprises a combining protrusion that is disposed on the outer face of the container and is inserted into a combining hole of the driving printed circuit board, and the combining hole of the driving printed circuit board has a shape extending in a direction for preventing the flexible printed circuit board from warping.

20. The display apparatus of claim 17, wherein the board combining member comprises a guiding protrusion that is disposed on the outer face of the container and combines the driving printed circuit board with the outer face of the container to prevent the flexible printed circuit board from warping.

* * * * *